US008618851B2

(12) United States Patent
Li

(10) Patent No.: US 8,618,851 B2
(45) Date of Patent: Dec. 31, 2013

(54) PHASE-LOCKED LOOP APPARATUS AND TUNING VOLTAGE PROVIDING CIRCUIT THEREOF

(75) Inventor: Hsiang-Chi Li, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 55 days.

(21) Appl. No.: 13/313,020

(22) Filed: Dec. 7, 2011

(65) Prior Publication Data
US 2013/0015896 A1 Jan. 17, 2013

(30) Foreign Application Priority Data

Jul. 14, 2011 (TW) .............................. 100124945 A

(51) Int. Cl.
*H03L 7/06* (2006.01)
(52) U.S. Cl.
USPC .......................................... 327/156; 327/147
(58) Field of Classification Search
None
See application file for complete search history.

(56) References Cited

U.S. PATENT DOCUMENTS

| 7,102,446 | B1 * | 9/2006 | Lee et al. | 331/11 |
|---|---|---|---|---|
| 7,719,329 | B1 * | 5/2010 | Smith et al. | 327/157 |
| 8,179,174 | B2 * | 5/2012 | Bunch | 327/156 |
| 2005/0200391 | A1 * | 9/2005 | Steinbach et al. | 327/156 |
| 2006/0082402 | A1 * | 4/2006 | Knotts | 327/156 |
| 2006/0114038 | A1 * | 6/2006 | Galloway | 327/156 |

* cited by examiner

*Primary Examiner* — Cassandra Cox
(74) *Attorney, Agent, or Firm* — Jianq Chyun IP Office

(57) ABSTRACT

A phase-locked loop apparatus (PLL apparatus) and a tuning voltage providing circuit thereof are provided. The PLL apparatus is for receiving an input signal and producing an output signal according to the received input signal. The PLL apparatus includes a voltage-controlled oscillator (VCO), a loop filter and a tuning voltage providing circuit. The VCO receives a control voltage and produces the output signal according to the received control voltage. The loop filter has a resistor-capacitor network and the network receives the control voltage and is coupled to a reference voltage. The tuning voltage providing circuit receives the output signal and the input signal and provides a tuning voltage to the resistor-capacitor network according to the input signal and the output signal.

20 Claims, 4 Drawing Sheets

PHASE-LOCKED LOOP APPARATUS AND TUNING VOLTAGE PROVIDING CIRCUIT THEREOF

CROSS-REFERENCE TO RELATED APPLICATION

This application claims the priority benefit of Taiwan application serial no. 100124945, filed on Jul. 14, 2011. The entirety of the above-mentioned patent application is hereby incorporated by reference herein and made a part of this specification.

BACKGROUND OF THE INVENTION

1. Field of the Invention

The invention generally relates to a phase-locked loop apparatus (PLL apparatus) and a tuning voltage providing circuit thereof, and more particularly, to an apparatus able to accelerate phase-locking operations of a PLL apparatus by using a tuning voltage providing circuit.

2. Description of Related Art

In order to provide a periodic signal with a stable phase, the PLL apparatus is the most often employed and the most reliable one. The PLL apparatus can effectively tune the phase of the output signal produced by itself according to the phase of an input signal, so that the PLL apparatus can serve as a frequency multiplier or a spread spectrum circuit able to dynamically and finely tune the frequency of the output signal thereof.

In a conventional PLL apparatus, affected by a capacitor with large capacitance in a loop filter of the apparatus, the phase-locking operation often costs a long time to be finished. In order to solve the above-mentioned problem, a scheme has been proposed, in which a control voltage of a voltage-controlled oscillator (VCO) in the PLL apparatus is preset in advance to a level closer to a stable level at which the PLL apparatus finishes the phase-locking operation. However, different circuit processes, different environment temperatures and different power voltage ranges in applications would affect the stable level of the control voltage. Thus, it is difficult to appropriately set the initial level of the control voltage.

In addition, another conventional approach is also used, by employing a charge pump that generates a larger charging current to perform a charging operation before the PLL apparatus finishes a frequency/phase-locking operation, and decreases the charging current after the PLL apparatus finishes the frequency/phase-locking operation. However, this approach would bring out many new problems such as an increased circuit area of the charge pump for providing a larger charging current, and difficulty in obtaining precise time points for switching the charging current.

SUMMARY OF THE INVENTION

Accordingly, the disclosure is directed to a PLL apparatus, which can effectively accelerate operations of locking the frequency and phase thereof.

The disclosure is also directed to a tuning voltage providing circuit able to make the belonged PLL apparatus effectively accelerate operations of locking the frequency and phase thereof.

In one aspect, a PLL apparatus is provided for receiving an input signal and producing an output signal according to the received input signal. The PLL apparatus includes a VCO, a loop filter and a tuning voltage providing circuit. The VCO receives a control voltage and produces the output signal according to the received control voltage. The loop filter is coupled between the VCO and a reference voltage and thereby receives the control voltage. The tuning voltage providing circuit is coupled to the loop filter and the VCO, further receives the output signal and the input signal and provides a tuning voltage to the loop filter according to the input signal and the output signal, in which the voltage level of the tuning voltage is different from the voltage level of the reference voltage.

In another aspect, a tuning voltage providing circuit is also provided, which is coupled to a loop filter of a PLL apparatus and receives an input signal and an output signal of the PLL apparatus. The loop filter of the PLL apparatus is coupled to a VCO for receiving a control voltage. The tuning voltage providing circuit includes a lock detection circuit, a control signal generator and a voltage-providing buffer. The lock detection circuit receives the input signal and the output signal, performs a sampling operation on the input signal according to the output signal, produces a sampling result and correspondingly produces a lock signal according to the sampling result. The control signal generator is coupled to the lock detection circuit, receives the lock signal and produces a control signal according to the lock signal. The voltage-providing buffer is coupled between the control signal generator and the loop filter, receives the control signal and the tuning voltage and decides whether or not to provide a tuning voltage to the loop filter according to the control signal, in which the tuning voltage is provided to the loop filter.

Based on the description of the embodiments above, while the PLL apparatus performs a locking operation, the tuning voltage providing circuit can provide the tuning voltage to the loop filter, so that the control voltage received by the loop filter can be tuned faster towards an appropriate level required for frequency and phase locking. In this way, the control voltage can faster reach stabilization. In other words, the phase-locking operation of the PLL apparatus can be effectively accelerated.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
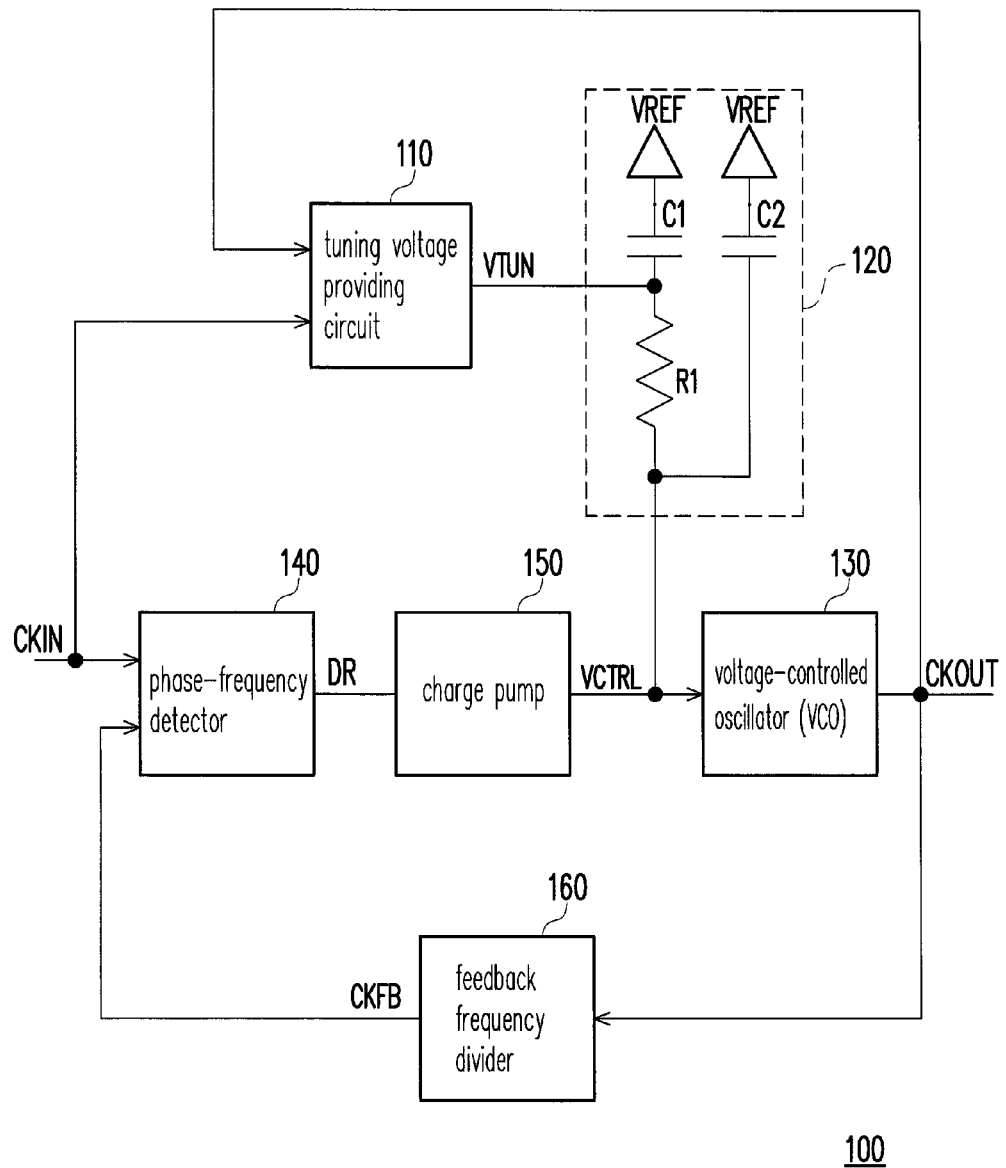
FIG. 1 is a schematic diagram of a PLL apparatus according to an embodiment.

FIG. 1 is a schematic diagram of a PLL apparatus 100 according to an embodiment. Referring to FIG. 1, a PLL apparatus 100 includes a tuning voltage providing circuit 110, a loop filter 120, a VCO 130, a phase-frequency detector 140, a charge pump 150 and a feedback frequency divider 160. The PLL apparatus 100 can receive a periodic input signal CKIN serving as a reference clock and produces an output signal CKOUT according to the input signal CKIN.

The phase-frequency detector 140 is used for receiving the input signal CKIN and a feedback signal CKFB produced by the feedback frequency divider 160. The phase-frequency detector 140 detects a phase difference between the input signal CKIN and the feedback signal CKFB and produces a phase-frequency detection result DR according to the detected phase difference. The phase-frequency detection result DR is transmitted to the charge pump 150 coupled to the phase-frequency detector 140, such that the charge pump 150 performs a charging operation or a discharging operation according to the phase-frequency detection result DR, in which the charge pump 150 performs the above-mentioned charging or discharging operations for increasing or decreasing a produced control voltage VCTRL.

In addition, the feedback signal CKFB received by the phase-frequency detector 140 is produced by the feedback frequency divider 160 which coupled between the phase-frequency detector 140 and the VCO 130. In brief, the feedback frequency divider 160 performs a frequency-dividing operation on the received output signal CKOUT so as to produce a corresponding feedback signal CKFB, in which the frequency divisor provided by the feedback frequency divider 160 for the frequency-dividing operation on the output signal CKOUT can be a real number greater than or equal to one. According to the requirements in applications, the feedback frequency divider 160 can be removed, while the output signal CKOUT can be directly fed back to serve as the feedback signal CKFB.

The control voltage VCTRL is produced at a terminal of the charge pump 150 and the terminal is coupled to the loop filter 120. The noise of the control voltage VCTRL can be filtered by the loop filter 120 to enable the VCO 130 to have a stable control voltage VCTRL for serving as an input of the VCO 130, and further enable the output signal CKOUT produced by the VCO 130 to have a stable frequency. In addition, the loop filter 120 also receives a tuning voltage VTUN produced by the tuning voltage providing circuit 110. In the embodiment, the tuning voltage VTUN provided by the tuning voltage providing circuit 110 is transmitted to a terminal where a filter capacitor C1 and a filter resistor R1 are coupled to each other. Preferably, the voltage level of the tuning voltage VTUN is different from the voltage level of a reference voltage VREF.

For example, the loop filter 120 can have a resistor-capacitor network formed by a combination of over one capacitor and a resistor. In the embodiment, the loop filter 120 includes a filter resistor R1 and two filter capacitors C1 and C2, in which the filter capacitor C2 is connected in series between a terminal where the VCO 130 and the loop filter 120 are coupled to each other and the reference voltage VREF. A terminal of the filter resistor R1 is coupled to the VCO 130 for receiving the control voltage VCTRL and the filter capacitor C1 is connected in series between the tuning voltage providing circuit 110 and the reference voltage VREF.

It should be noted that the loop filter 120 can be implemented with various circuit structures, and the terminal coupled to the tuning voltage VTUN and the terminal for receiving the control voltage VCTRL are not limited to the above-mentioned terminals of the embodiment. In some of other embodiments, the filter resistor R1 is not a necessary part in the loop filter 120. For example, in some embodiments, the required resistance can be obtained by means of the resistance of the transmission wire and/or the parasitic resistors at each connection node between components. Moreover, in further other embodiments, the required resistance characteristic can also be effectively obtained by charging-discharging occurding in switching current. As a result, it is not necessary to dispose a physical filter resistor R1 in the loop filter 120. In fact, in yet other embodiments, more filter resistors and/or more filter capacitors can be added, and they can coupled to each other with various connections in series and/or in parallel.

The tuning voltage providing circuit 110 receives the output signal CKOUT and the input signal CKIN and decides whether or not to provide the tuning voltage VTUN to the loop filter 120 according to the input signal CKIN and the output signal CKOUT.

In more details, the tuning voltage providing circuit 110 is used to detect the frequency-locking operation of the PLL apparatus 100 to judge whether the frequency locking operation is finished or not. Preferably, the tuning voltage providing circuit 110 can judge whether the frequency-locking operation is finished or not according to the frequency multiple relationship between the input signal CKIN and the output signal CKOUT. When the tuning voltage providing circuit 110 judges that the frequency-locking operation of the PLL apparatus 100 is not finished yet, a tuning voltage VTUN is provided to the loop filter 120 so that the control voltage VCTRL changes faster towards the tuning voltage VTUN. On the contrary, when the tuning voltage providing circuit 110 detects that the frequency of the output signal CKOUT is within a locked frequency range, i.e., the frequency of the output signal CKOUT is close to N times of the frequency of the input signal CKIN, the tuning voltage providing circuit 110 stops outputting the tuning voltage VTUN.

During the frequency and phase locking operation of the PLL apparatus 100, the control voltage VCTRL would change downwards from a relatively higher voltage level of the reference voltage VREF or change upwards from a relatively lower voltage level of the reference voltage VREF. As a result, the above-mentioned drifting of the control voltage VCTRL can be accelerated by the provided tuning voltage VTUN, which further accelerates the frequency and phase locking operation of the PLL apparatus 100. In other words, when the reference voltage VREF has a relatively higher voltage level, the tuning voltage VTUN may require a relatively lower voltage level; on the contrary, when the reference voltage VREF has a relatively lower voltage level, the tuning voltage VTUN ma require a relatively higher voltage level.

It should be noted that in the embodiment of FIG. 1, the provided tuning voltage VTUN is sent to between the filter resistor R1 and the filter capacitor C1. However, the invention is not limited to the above-mentioned destination location. In some of other embodiments, the provided tuning voltage VTUN is sent to a terminal coupled to the control voltage VCTRL in the resistor-capacitor network in a loop filter 220, and accordingly, the transition of the control voltage VCTRL can be accelerated and thereby the PLL apparatus 200 can lock frequency and phase faster.

Figure 2:
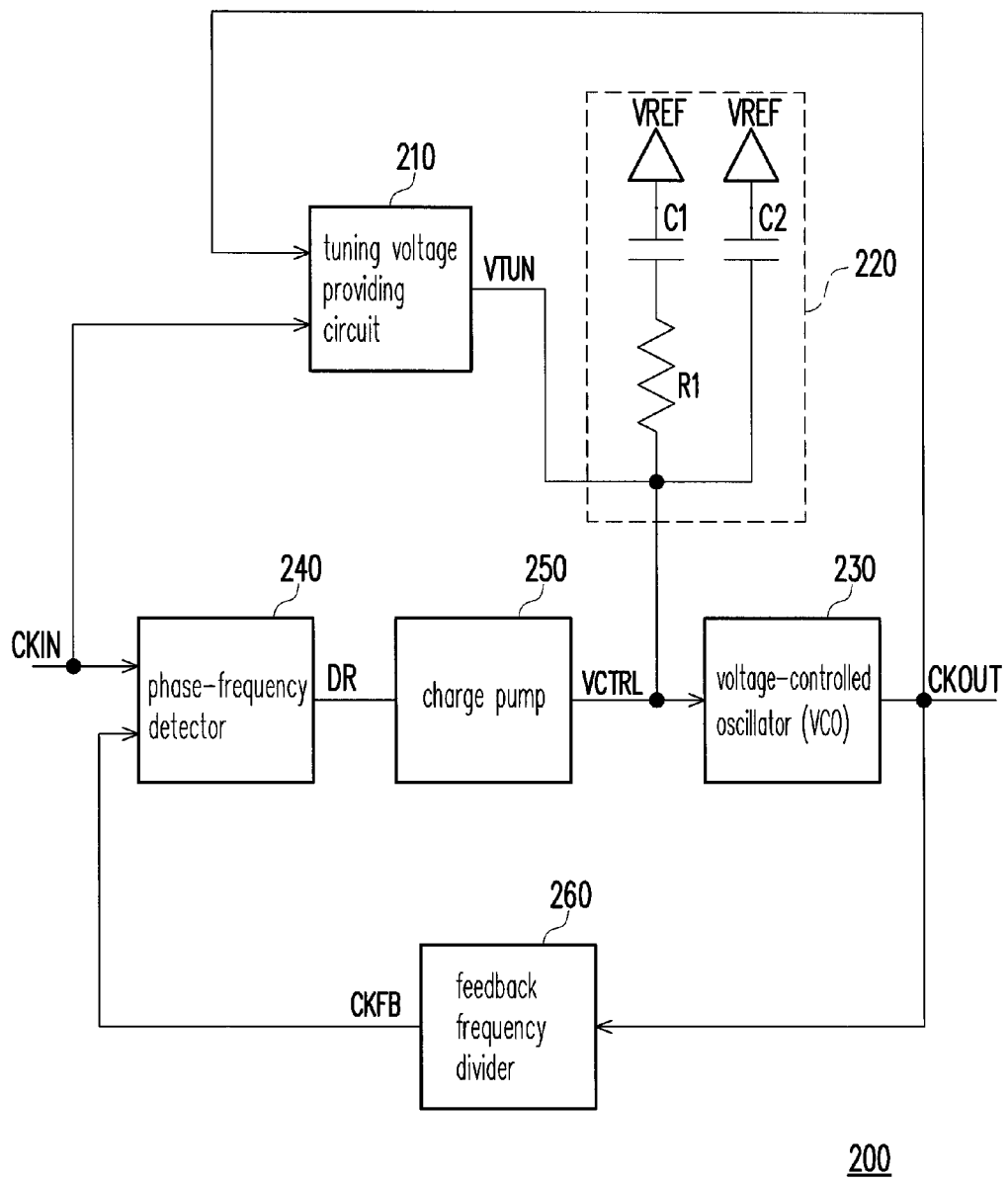
FIG. 2 is a schematic diagram of a PLL apparatus according to another embodiment.

For example, referring to FIG. 2 which is a schematic diagram of a PLL apparatus 200 according to another embodiment, the PLL apparatus 200 includes a tuning voltage providing circuit 210, a loop filter 220, a VCO 230, a phase-frequency detector 240, a charge pump 250 and a feedback frequency divider 260. The main difference of the embodiment of FIG. 2 from the embodiment of FIG. 1 is that the tuning voltage VTUN provided by the tuning voltage providing circuit 210 is sent to a terminal of the loop filter 220 where the control voltage VCTRL is received, i.e., a terminal at which the filter resistor R1 is connected to the common terminal of the charge pump 250 and the VCO 230.

Figure 3A:
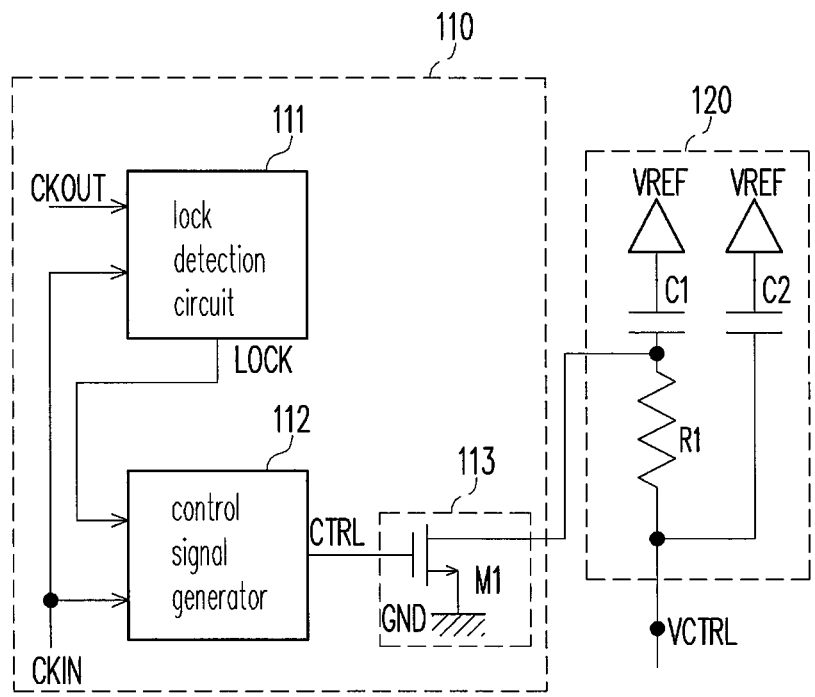
FIGS. 3A and 3B are detailed structure diagrams of two tuning voltage providing circuits 110 according to two different embodiments.
Figure 3B:
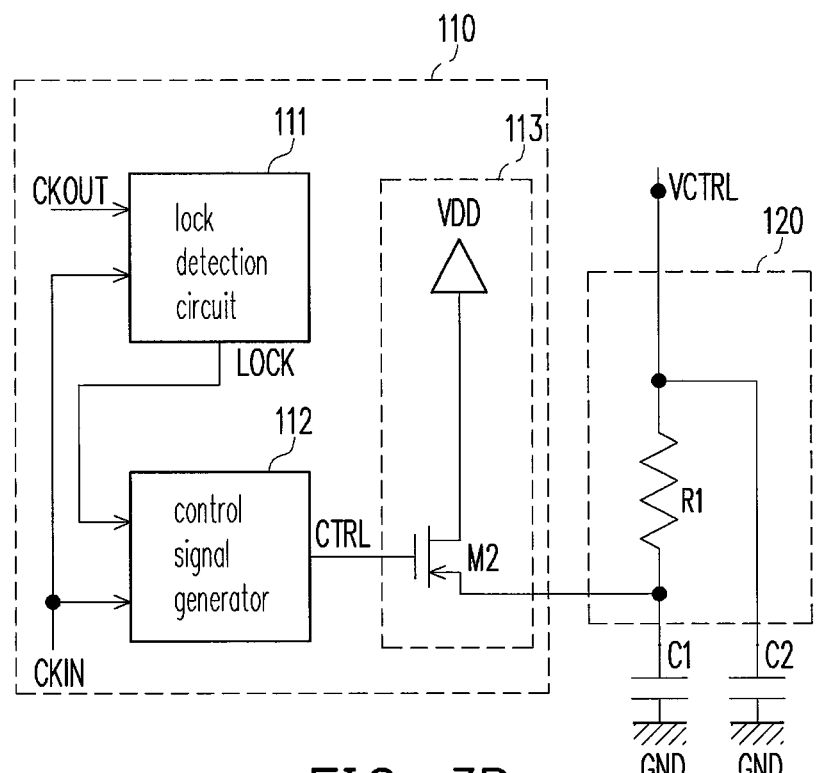

FIGS. 3A and 3B are detailed structure diagrams of two tuning voltage providing circuits 110 according to two different embodiments. Referring to FIG. 3A, the tuning voltage providing circuit 110 includes a lock detection circuit 111, a control signal generator 112 and a voltage-providing buffer 113. The lock detection circuit 111 receives the input signal CKIN and the output signal CKOUT so as to perform sampling operation on the input signal CKIN according to the output signal CKOUT and produce a lock signal LOCK according to the sampling result. The control signal generator 112 can be coupled to the lock detection circuit 111, receives the lock signal LOCK and produces a control signal CTRL according to the lock signal LOCK. The voltage-providing buffer 113 can be coupled between the control signal generator 112 and the loop filter 120, receive the control signal CTRL and a tuning voltage (for example, a ground voltage GND) and decide whether or not to provide the tuning voltage to the loop filter according to the control signal CTRL.

It should be noted that since the frequency of the output signal CKOUT is higher than the frequency of the input signal CKIN, the lock detection circuit 111 can use the transition edge of the output signal CKOUT for sampling the input signal CKIN so as to calculate the frequency ratio between the output signal CKOUT and the input signal CKIN and use the frequency ratio as a sampling result.

After comparing the sampling result with a locked threshold, it can be judged out that whether or not the PLL apparatus finishes a frequency-locking operation. The locked threshold is used to define the above-mentioned locked frequency range. For example, when the target frequency of the output signal CKOUT is set with N times of the frequency of the input signal CKIN (the corresponding frequency divisor of the feedback frequency divider 160 is equal to N), the locked threshold can be set to a value quite close to N, for example, 0.9N.

When the sampling result is greater than a locked threshold, it means that the frequency of the output signal CKOUT is within the locked frequency range and the frequency-locking operation has been finished by the PLL apparatus 100. Thereafter, the lock detection circuit 111 produces a lock signal LOCK to instruct the control signal generator 112 to generate a corresponding control signal CTRL for controlling the voltage-providing buffer 113 to stop providing the tuning voltage VTUN. In addition, the lock detection circuit 111 and the control signal generator 112 can also stop operating to save power.

On the contrary, when the sampling result is less than the locked threshold, it means that the frequency of the output signal CKOUT is out of the locked frequency range and the frequency-locking operation has not been finished in the PLL apparatus 100. Thereafter, the lock detection circuit 111 can produce a lock signal LOCK to instruct the control signal generator 112 to generate a corresponding control signal CTRL for controlling the voltage-providing buffer 113 to provide the tuning voltage VTUN to accelerate the operation of the loop filter 120.

The voltage-providing buffer 113 can be preferably implemented with, for example, a transistor through a simple open drain connection. In the resistor-capacitor network of the loop filter 120 of the embodiment, both the filter capacitors C1 and C2 are coupled to a power voltage VDD. In order to match the architecture of the loop filter 120, the voltage-providing buffer 113 is implemented with an N-type transistor M1, with a control terminal (gate) receiving the control signal CTRL, a terminal receiving the ground voltage GND and another terminal coupled to the loop filter 120.

When the transistor M1 receives a control signal CTRL with a high voltage level (greater than the threshold voltage of the transistor M1), the transistor M1 is turned on and provides the ground voltage GND serving as the tuning voltage to the loop filter 120. On the contrary, when the transistor M1 receives a control signal CTRL with low voltage level (less than the threshold voltage of the transistor M1), the transistor M1 is turned off, causing a high impedance at the terminal of the transistor M1 connected to the loop filter 120. At the time, the tuning voltage provided by the voltage-providing buffer 113 is able to accelerate the transition of the control voltage VCTRL from high voltage level to low voltage level.

Referring to FIG. 3B, which is a detailed structure diagram of a tuning voltage providing circuit 110 according to another embodiment. The main difference of the embodiment of FIG. 3B from FIG. 3A is that the two filter capacitors C1 and C2 in the employed loop filter 120 of the embodiment are coupled to the ground voltage GND, and in order to match the architecture of the loop filter 120, the voltage-providing buffer 113 can be implemented with a P-type transistor M2 which is coupled to the power voltage VDD. When the transistor M2 receives a control signal CTRL at a low voltage level, it can be turned on, further providing the power voltage VDD as the tuning voltage to the loop filter 120.

It should be noted that the voltage-providing buffer 113 can be implemented with various structures, not limited to the embodiments of FIGS. 3A and 3B. For example, the voltage-providing buffer 113 can have a switching device (often implemented with a transistor) able to be appropriately switched so as to provide a charging current or a discharging current to the filter capacitors in the loop filter during turning on the switch, which can accelerate the charging/discharging operations of the filter capacitors. In other embodiments, the voltage-providing buffer 113 can be implemented with a bias current source, in which the bias current source can be turned on to provide a charging current or a discharging current to the filter capacitors in the loop filter under an appropriate bias voltage.

Figure 4:
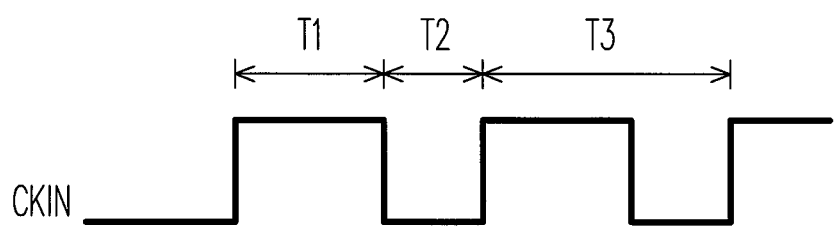
FIG. 4 is an operation diagram of a voltage-providing buffer according to an embodiment.

FIG. 4 is an operation diagram of a voltage-providing buffer according to an embodiment. Referring to FIGS. 3A, 3B and 4, a control signal generator 112 in a tuning voltage providing circuit 110 of FIG. 4 would acquire a tuning duration T1 according to a received input signal CKIN. For example, when a PLL apparatus is started, the control signal generator 112 make a certain duration in a certain period of the received input signal CKIN (for example, the first period) as the tuning duration T1, in which the input signal CKIN takes positive voltage in the certain duration.

First, in the tuning duration T1, the control signal generator generates a control signal according to a lock signal to provide a tuning voltage into the loop filter so as to advance the locking speed of the PLL apparatus.

Then, in a tuning-stopping duration T2 which are in the same period as the tuning duration T1, the control signal generator 112 instructs the tuning voltage providing circuit 110 to stop providing the tuning voltage into the loop filter, so that the control voltage received by the VCO resumes stable status.

After that, the operation proceeds to a frequency detection duration T3 in the next period after the tuning duration T1, and the tuning voltage remains not provided in the frequency detection duration T3. Meanwhile, the lock detection circuit in the tuning voltage providing circuit would detect the locking operation according to the input signal CKIN and judge whether or not the locking operation is finished. In the duration T3, if the frequency-locking operation detected out by the lock detection circuit has not been finished, the control signal generator would enter the tuning duration again in the next period of the frequency detection duration T3 and instruct the voltage-providing buffer to provide the tuning voltage to the loop filter so as to finish the frequency-locking operation of the PLL apparatus.

In summary, in the above-mentioned embodiments, a tuning voltage is additionally provided to the loop filter so that the control voltage coupled to the loop filter can change faster so as to accelerate the stabilization of the control voltage. As a result, the operations of locking the frequency and phase of the PLL apparatus can be faster finished.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A phase-locked loop apparatus, receiving an input signal and producing an output signal according to the received input signal; the phase-locked loop apparatus comprising:
    a voltage-controlled oscillator, receiving a control voltage and producing the output signal according to the received control voltage;
    a loop filter, coupled between the voltage-controlled oscillator and a reference voltage and receiving the control voltage; and
    a tuning voltage providing circuit, coupled to the loop filter and the voltage-controlled oscillator, further receiving the output signal and the input signal and providing a tuning voltage to the loop filter according to the input signal and the output signal,
    wherein the tuning voltage providing circuit judges whether or not the frequency ratio between the input signal and the output signal is greater than a locked threshold to decide whether or not provide the tuning voltage.

2. The phase-locked loop apparatus as claimed in claim 1, wherein a voltage level of the tuning voltage is different from a voltage level of the reference voltage.

3. The phase-locked loop apparatus as claimed in claim 1, wherein the tuning voltage providing circuit judges whether a frequency of the output signal is within a locked frequency range or not so as to decide to provide the tuning voltage or not according to frequencies of the output signal and the input signal.

4. The phase-locked loop apparatus as claimed in claim 1, wherein the tuning voltage providing circuit provides the tuning voltage at first, then stops to provide the tuning voltage, and during stopping providing the tuning voltage, the tuning voltage providing circuit judges whether or not to continue to provide the tuning voltage.

5. The phase-locked loop apparatus as claimed in claim 1, wherein in a first duration of a period of the input signal, the tuning voltage providing circuit provides the tuning voltage to the loop filter; and in a second duration after the first duration of the period of the input signal, the tuning voltage providing circuit stops providing the tuning voltage to the loop filter.

6. The phase-locked loop apparatus as claimed in claim 5, wherein the tuning voltage providing circuit further in a next period of the input signal decides whether or not providing the tuning voltage in a period immediately after the next period according to frequencies of the output signal and the input signal.

7. The phase-locked loop apparatus as claimed in claim 1, wherein the tuning voltage providing circuit comprises:
    a voltage-providing buffer, coupled to the loop filter, receiving a control signal and providing the tuning voltage according to the control signal.

8. The phase-locked loop apparatus as claimed in claim 7, wherein the voltage-providing buffer comprises:
    a transistor, wherein a first terminal of the transistor is coupled to the loop filter to provide the tuning voltage, a second terminal of the transistor is coupled to a voltage different from the reference voltage and a control terminal of the transistor is coupled to the control signal.

9. The phase-locked loop apparatus as claimed in claim 7, wherein the tuning voltage providing circuit further comprises:
    a lock detection circuit, receiving the input signal and the output signal, sampling the input signal according to the output signal and producing a lock signal according to a sampling result; and
    a control signal generator, coupled to the lock detection circuit, receiving the lock signal and producing the control signal according to the lock signal.

10. The phase-locked loop apparatus as claimed in claim 1, wherein the loop filter comprises:
    a first filter capacitor, wherein a first terminal thereof is coupled to the tuning voltage produced by the tuning voltage providing circuit and a second terminal thereof is coupled to the reference voltage.

11. The phase-locked loop apparatus as claimed in claim 10, wherein the loop filter comprises:
    a filter resistor, wherein a first terminal of the filter resistor is coupled to the voltage-controlled oscillator to receive the control voltage and a second terminal of the filter resistor is coupled to the first terminal of the first filter capacitor.

12. The phase-locked loop apparatus as claimed in claim 11, wherein the first terminal of the first filter capacitor or the first terminal of the filter resistor receives the tuning voltage.

13. The phase-locked loop apparatus as claimed in claim 10, wherein the loop filter comprises:
    a second filter capacitor, connected in series between the reference voltage and the voltage-controlled oscillator.

14. The phase-locked loop apparatus as claimed in claim 10, wherein the tuning voltage providing circuit comprises a voltage-providing buffer, which comprises a transistor, wherein a first terminal of the transistor is coupled to the loop filter to provide the tuning voltage, a second terminal of the transistor is coupled to a voltage different from the reference voltage and a control terminal of the transistor is coupled to a control signal.

15. A tuning voltage providing circuit, used for coupling a loop filter of a phase-locked loop apparatus, wherein the loop filter is coupled to a voltage-controlled oscillator for receiving a control voltage; the tuning voltage providing circuit comprising:
    a lock detection circuit, producing a lock signal according to an input signal and an output signal of the phase-locked loop apparatus;
    a control signal generator, coupled to the lock detection circuit, receiving the lock signal and producing a control signal according to the lock signal; and
    a voltage-providing buffer, coupled between the control signal generator and the loop filter, receiving the control signal and the tuning voltage and deciding whether or not to provide a tuning voltage to the loop filter according to the control signal.

16. The tuning voltage providing circuit as claimed in claim 15, wherein the lock detection circuit performs a sampling operation on the input signal according to the output signal and produces the lock signal according to a sampling result.

17. The tuning voltage providing circuit as claimed in claim 15, wherein the lock detection circuit judges whether or not the frequency ratio between the input signal and the output signal is greater than a locked threshold so as to produce the lock signal.

18. The tuning voltage providing circuit as claimed in claim 15, wherein in a first duration of a period of the input signal, the voltage-providing buffer provides the tuning voltage to the loop filter; and in a second duration after the first duration of the period of the input signal, the voltage-providing buffer stops providing the tuning voltage to the loop filter.

19. The tuning voltage providing circuit as claimed in claim 18, wherein the lock detection circuit further in a next period of the input signal produces the lock signal according to frequencies of the output signal and the input signal.

20. The tuning voltage providing circuit as claimed in claim 15, wherein the voltage-providing buffer comprises:
a transistor, wherein a first terminal of the transistor is coupled to the loop filter to provide the tuning voltage, the loop filter coupled to a reference voltage, a second terminal of the transistor is coupled to a voltage different from the reference voltage and a control terminal of the transistor is coupled to the control signal.

* * * * *